United States Patent
Zhu et al.

(10) Patent No.: US 9,978,712 B2
(45) Date of Patent: May 22, 2018

(54) MULTI-CHANNEL MCM WITH TEST CIRCUITRY FOR INTER-DIE BOND WIRE CHECKING

(71) Applicant: Texas Instruments Incorporated, Dallas, TX (US)

(72) Inventors: Danyang Zhu, Beijing (CN); Zhuang Ma, Beijing (CN); Xinyu Yin, Beijing (CN); Michael Dean Shilhanek, Garland, TX (US); Steven Bolen, Plano, TX (US); Albert Eardley, Carrizo Springs, TX (US); Abha Singh Kasper, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days. days.

(21) Appl. No.: 15/164,608

(22) Filed: May 25, 2016

(65) Prior Publication Data
US 2017/0194285 A1  Jul. 6, 2017

Related U.S. Application Data

(63) Continuation of application No. PCT/CN2015/100120, filed on Dec. 31, 2015.

(51) Int. Cl.
*H01L 23/00* (2006.01)
*H01L 21/66* (2006.01)
(Continued)

(52) U.S. Cl.
CPC ............ *H01L 24/85* (2013.01); *G01R 31/041* (2013.01); *G01R 31/2853* (2013.01);
(Continued)

(58) Field of Classification Search
CPC ... H01L 24/85; H01L 22/34; H01L 2224/859; H01L 2924/14252; G01R 31/041
(Continued)

(56) References Cited

U.S. PATENT DOCUMENTS

| 8,198,951 B2 | 6/2012 | Dong et al. |
| 2002/0175348 A1 | 11/2002 | Stadler |

(Continued)

FOREIGN PATENT DOCUMENTS

CN  2789929 Y  6/2006

OTHER PUBLICATIONS

Search Report for PCT/CN2015/100120, dated Aug. 26, 2016 (1 page).

*Primary Examiner* — Cuong Q Nguyen
*Assistant Examiner* — Tong-Ho Kim
(74) *Attorney, Agent, or Firm* — William B. Kempler; Charles A. Brill; Frank D. Cimino

(57) ABSTRACT

A multichip module (MCM) device include a first die including functional circuitry bonded by a plurality of inter-die bond wires (bond wires) to a second die having functional circuitry. A first channel (Channel A) and second channel (Channel B) each have separate top and bottom signal paths (signal paths) including one of the bond wires. A failure of any of the signal paths does not affect functionality of the device. The first die includes input pins including a first input pin (P1), a second input pin (P2), and coupling circuitry including cross-channel test circuitry positioned between the input pins and the functional circuitry. The coupling circuitry provides for Channel A and Channel B a first configuration for normal mode operation and a second configuration for test mode operation for single bond wire testing for checking continuity of any of the bond wires.

14 Claims, 6 Drawing Sheets

(51) Int. Cl.
*G01R 31/04* (2006.01)
*G01R 31/28* (2006.01)

(52) U.S. Cl.
CPC ...... *H01L 22/34* (2013.01); *H01L 2224/0603* (2013.01); *H01L 2224/48247* (2013.01); *H01L 2224/859* (2013.01); *H01L 2924/00014* (2013.01); *H01L 2924/14252* (2013.01)

(58) Field of Classification Search
USPC .......................................... 257/48, 673, 668
See application file for complete search history.

(56) References Cited

U.S. PATENT DOCUMENTS

| | | | | |
|---|---|---|---|---|
| 2005/0272378 | A1* | 12/2005 | Dupuis | H04L 25/0266 455/67.15 |
| 2007/0176632 | A1* | 8/2007 | McNamara | H03K 19/1732 326/47 |
| 2009/0213914 | A1* | 8/2009 | Dong | H01L 23/48 375/219 |
| 2010/0052826 | A1* | 3/2010 | Callahan | H01L 25/0655 333/24 R |
| 2014/0365838 | A1* | 12/2014 | Tekumalla | G01R 31/318547 714/726 |
| 2017/0019095 | A1* | 1/2017 | Leong | H03K 17/167 |

* cited by examiner (TEST MODE)

(NORMAL MODE)

MULTI-CHANNEL MCM WITH TEST CIRCUITRY FOR INTER-DIE BOND WIRE CHECKING

CROSS REFERENCE TO RELATED APPLICATIONS

This is a continuation of copending International Application No. PCT/CN2015/100120 entitled "MULTI-CHANNEL MCM WITH TEST CIRCUITRY FOR INTER-DIE BOND WIRE CHECKING", with an international filing date of Dec. 31, 2015, which designated the United States and is herein incorporated by reference in its entirety.

FIELD

Disclosed embodiments relate to electrical testing of multichip module (MCM) semiconductor devices having multiple paths per channel each with bond wire connections between respective die.

BACKGROUND

Some multi-channel MCM IC devices have at least 2 paths per channel, where a path failure in one channel does not affect functionality of the device and there is no conventional measured test parameter that can reflect the path failure. Isolated gate driver ICs, such as capacitively isolated ICs, is one example of such devices. A gate driver is a power amplifier that accepts a low-power input (e.g., a pulse-width modulation (PWM) input) from a controller IC and produces a high-current drive input for driving the gates of high-power transistors such comprising an Insulated Gate Bipolar Transistor (IGBT) or power metal-oxide-semiconductor field-effect transistor (MOSFET).

In operation isolated gate driver ICs receive a control signal and send the signal across an isolation barrier to drive the power devices. Such gate driver ICs are generally a MCM solution with TX (transmitter) die and at least one RX (receiver) die on respective sides of isolation barrier. Capacitive isolation is a relatively new technology that can be used for the isolation barrier. There are 2 inter-die bond wires connecting pins on the TX die to pins on the RX die for each channel as a differential bond wire per channel is known to provide better noise immunity. Capacitive isolation technology uses differential (both positive and negative) isolation capacitor for better noise immunity.

The signal transmission from the TX die to RX die fails if both inter-die bond wires are missing or are otherwise causing an open circuit condition. However, if only one of the bond wires is missing (or is open), signals can still be passed by the other bond wire to the output of the gate driver, but with somewhat degraded noise immunity. Known test solutions to this problem include using additional noise immunity tests or other tests to check whether there is any inter-die bond wires missing or open, and X-ray imaging (see FIG. 4B described below).

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize known testing lateral multichip module (MCM) devices that have at least 2 paths per channel, each path with a bond wire, where one path failure in the channel does not affect device functionality and there is no conventional measured test parameter that can identify a single path failure, have shortcomings. One example of such a device is an isolated gate driver (IGD). Known noise immunity testing to check whether there is any inter-die bonding wire problems (e.g., missing inter-die bond wires) is not a reliable test solution because there is no clear boundary between failing and passing IGD devices. Moreover, known X-ray testing for detecting inter-die bond wire problems for such ICs not being an electrical test cannot be integrated into existing final test flow, and also significantly increases the total test cost. Failing to properly screen (and reject) such MCMs having an inter-die bond wire problem can cause field returns and an adverse revenue impact, such as MCM IGDs for automotive applications.

Disclosed embodiments include MCM devices include a first die including functional circuitry bonded by a plurality of inter-die bond wires (bond wires) to at least a second die having functional circuitry. A first channel (Channel A) and second channel (Channel B) each have separate top and bottom signal paths (signal paths) including one of the bond wires. A failure of any of the signal paths does not affect functionality of the MCM. The first die includes input pins including a first input pin (P1), a second input pin (P2), and coupling circuitry including cross-channel test circuitry positioned between the input pins and the functional circuitry. The coupling circuitry provides Channel A and Channel B in a first configuration for normal mode operation, and a second configuration for test mode operation for single bond wire testing for checking continuity of any of the bond wires.

BRIEF DESCRIPTION OF THE DRAWINGS

Reference will now be made to the accompanying drawings, which are not necessarily drawn to scale, wherein.

DETAILED DESCRIPTION

Figure 1A:
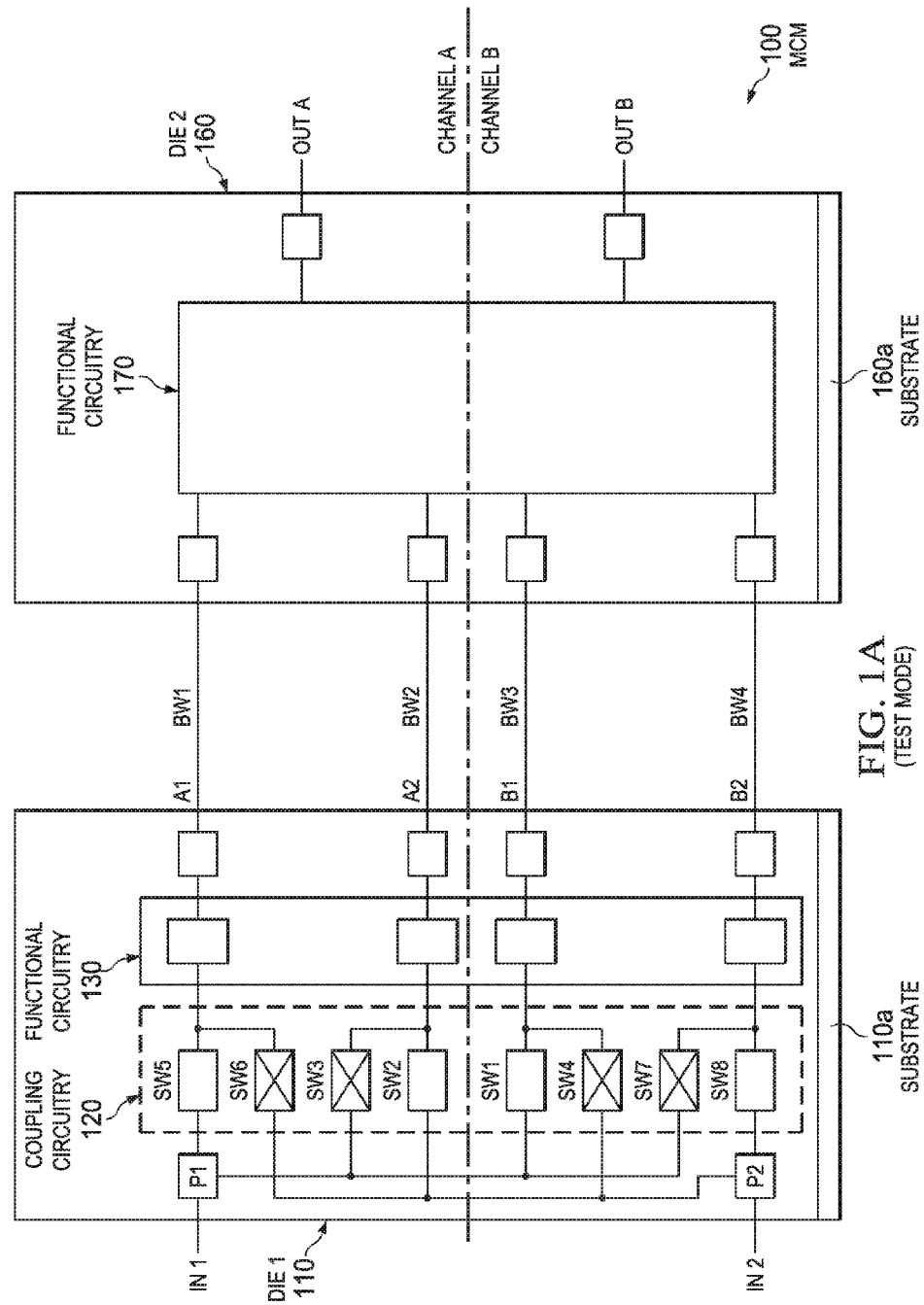
FIG. 1A represents an example wirebonded 2-channel MCM device having 2 paths per channel with each path having a bond wire, where one path failure in any channel does not affect device functionality, comprising coupling circuitry including cross-channel test circuitry comprising switches shown in positions for enabling inter-die bond wire checking, with the switches shown in positions for providing test mode operation, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A represents an example wire bonded 2-channel MCM 100 comprising Die 1 110 and Die 2 160 having 2 paths per channel with each path having a bond wire, where one path failure in any channel does not affect device functionality, according to an example embodiment. Functional circuitry as used herein is integrated circuitry that realizes and carries out desired functionality, such as that of a digital IC (e.g., digital signal processor) or analog IC (e.g., amplifier or power converter), such as a BiMOS IC. The capability of functional circuitry provided may vary, for example ranging from a simple device to a complex device. The specific functionality contained within functional circuitry is not of importance to disclosed embodiments.

MCM 100 includes coupling circuitry 120 including cross-channel test circuitry shown as switches SW1-SW8 for enabling inter-die bond wire checking, with the switches shown in a second configuration for providing test mode operation. Enabling of the test mode or normal mode can be provided by a variety of arrangements, such as from bias applied to a pin on MCM 100 for this purpose.

Although the coupling circuitry 120 is shown comprising switches SW1-SW8, the coupling circuitry 120 can also comprise a logic gates, such as NAND or NOR. Die 1 110 comprises substrate 110*a* that includes functional circuitry 130 and Die 2 160 comprises substrate 160*a* that includes functional circuitry 170. An "X" shown for any switch indicates the switch is open while lack of an X indicates the switch is closed (conductive). Channel A is shown having path A1 with bond wire (BW1) and path A2 with BW2, and Channel B shown having path B1 with BW3, and path B2 with BW4.

Although MCM 100 is shown with 8 switches which allows connecting any input (IN1 or IN2) to any of the bond wires BW1, BW2, BW3, BW4 for covering all possible bond wire test combinations, normal mode operation and full bond wire test coverage can be implemented with only 4 switches or logic gates. Generally, for a 2-input 2-output device such as MCM 100 having 4 bond wires (BW1-BW4), only 4 switches or logic gates (2N where N=the number of channels) can be provided and still provide normal mode operation and test mode operation for identifying any single missing bond wire. For MCM 100 the 4 switches would be SW1, SW2, SW3 and SW4. More generally, for devices with more than N>2 channels, N*2N switches allow connecting any input to any bond wire. In FIG. 1A SW1 is for switchably coupling P1 to Channel B, SW2 is for switchably coupling P2 to Channel A, SW3 is for switchably decoupling P1 from one of the top and bottom paths of Channel A coupled to during normally operating, and SW4 is for switchably decoupling P2 from one of the top and bottom paths of Channel B coupled to during normally operating.

Figure 1B:
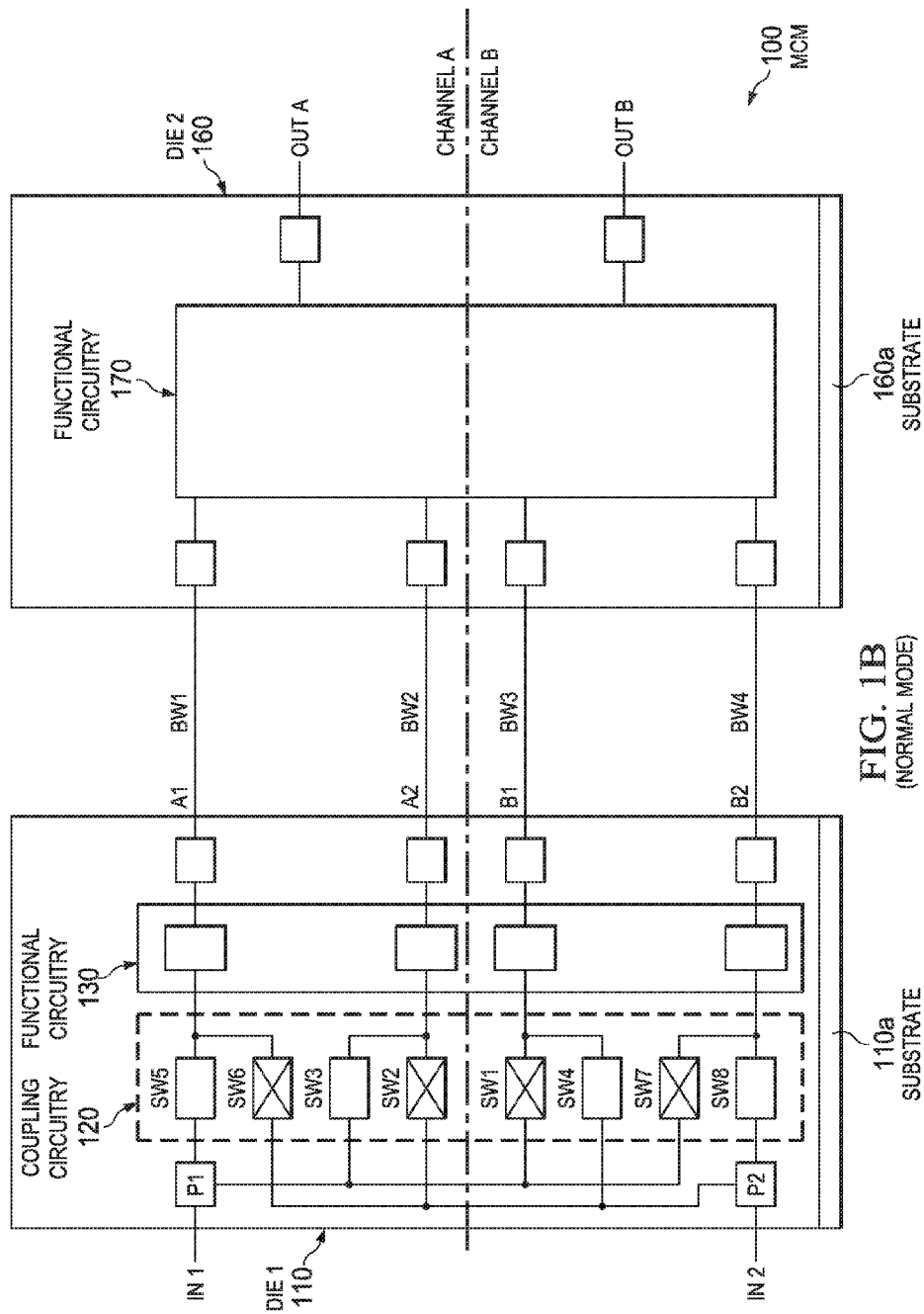
FIG. 1B represents the example MCM device in FIG. 1A with the switches shown in positions for providing normal mode operation.

FIG. 1B represents the MCM 100 in FIG. 1A with the switches SW1-SW8 shown in positions for providing normal mode operation. As described above, switching between the normal mode and the test mode can be provided by a variety of arrangements, such as from external bias applied to pins on the MCM 100.

A method of inter-die bond wire testing includes providing a MCM device, such as MCM 100, where the coupling circuitry includes cross-channel test circuitry positioned between the input pins and functional circuitry on the Die 1, with the coupling circuitry providing Channel A and Channel B in a first configuration for normal mode operation and a second configuration for test mode operation for single bond wire testing for checking continuity of any of the bond wires. First single bond wire testing (first testing) has the coupling circuitry set in the first configuration, and first test results are obtained. Second single bond wire testing (second testing) has the coupling circuitry set in the second configuration and second test results are obtained. The results from the first testing and second testing are used for identifying failures for any of the bond wires.

During such disclosed test mode operations, the test signals are sent only on one of the two bond wires in each channel, so a single test signal is used instead of a conventional differential signal. Since a single bond wire can still pass the test signal, there will be an output signal on the output (OUTA or OUTB) of the MCM device if the bond wire connection under test is good (continuous). The IC's output will fail if the bond wire under test has any continuity problems. Disclosed bond wire testing electrically identifies inter-die bonding wire problems (e.g., missing bond wires, broken bond wires, or any other condition that can cause an open on the signal channel), while providing a clear boundary between failing and passing devices. Inter-die bonding wire failures (e.g., missing inter-die bond wires) may be evidenced by no output signal.

For an example 2 channel device having a non-inverting (positive) channel and an inverting (negative) channel with 2 bond wires for each channel, each bond wire can be tested one at a time so that there are 4 total bond wire tests. The test can also be performed in two steps, a positive bond wire check (associated with both positive channels) and a negative bond wire check (associated with both negative channels). To improve test efficiency, for a MCM with >2 isolation channels, the coupling circuitry can re-arrange the checks so that all the channels on the IC can be checked in only two steps to save test time, such as a positive bond wire check associated with all the positive channels and a negative bond wire check associated with all the negative channels.

Figure 2:
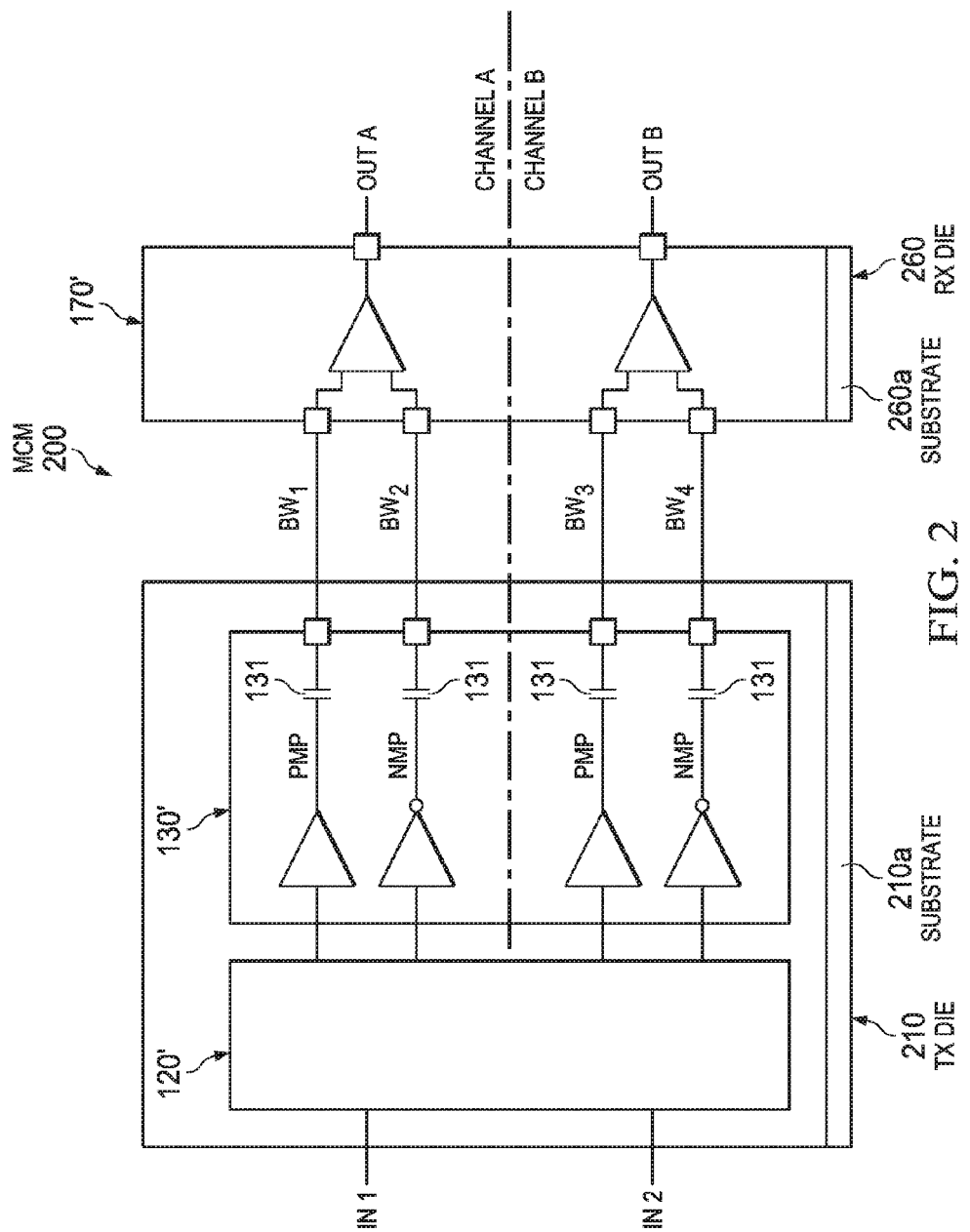
FIG. 2 is a depiction of an example 2-channel MCM IC device comprising an isolated gate driver having 2 paths per channel each with a bond wire in each path where one path failure in any channel does not affect device functionality, where the first die comprises a transmitter die and the second die comprises a receiver die, with the top and bottom signal paths of the first die being a positive modulation path (PMP) and a negative modulation path (NMP), according to an example embodiment.

FIG. 2 is a depiction of an example 2-channel MCM comprising an isolated gate driver (MCM 200) having 2 paths per channel each with each path having a bond wire, where one path failure in any channel does not affect device functionality, according to an example embodiment. As known in the art, a gate driver is a power amplifier that accepts a low-power input from a controller IC and produces a high-current drive input for the gates of high-power transistors such as an IGBT or power MOSFET. In essence, a gate driver include a level shifter in combination with an amplifier.

The first die comprises a transmitter (TX) die 210 formed on substrate 210a that includes coupling circuitry 120' and functional circuitry 130' and the second die comprises a receiver (RX) die 260 formed on substrate 260a that includes functional circuitry 170', with the top and bottom signal paths of the TX die 210 being a positive modulation path (PMP) and a negative modulation paths (NMPs) having the inverter shown.

The top and bottom signal paths of Channel A (PMP and NMP) and Channel B (PMP and NMP) each include at least one isolation barrier on the TX die 210 shown as a capacitor 131. In this embodiment the dielectric material for the capacitors can comprise silicon oxide or polyimide. The isolation barrier however can be on either die, or on both die. Moreover, the isolation barrier can be other than an isolation capacitor, such as being inductive (or magnetic) barrier.

Figure 3:
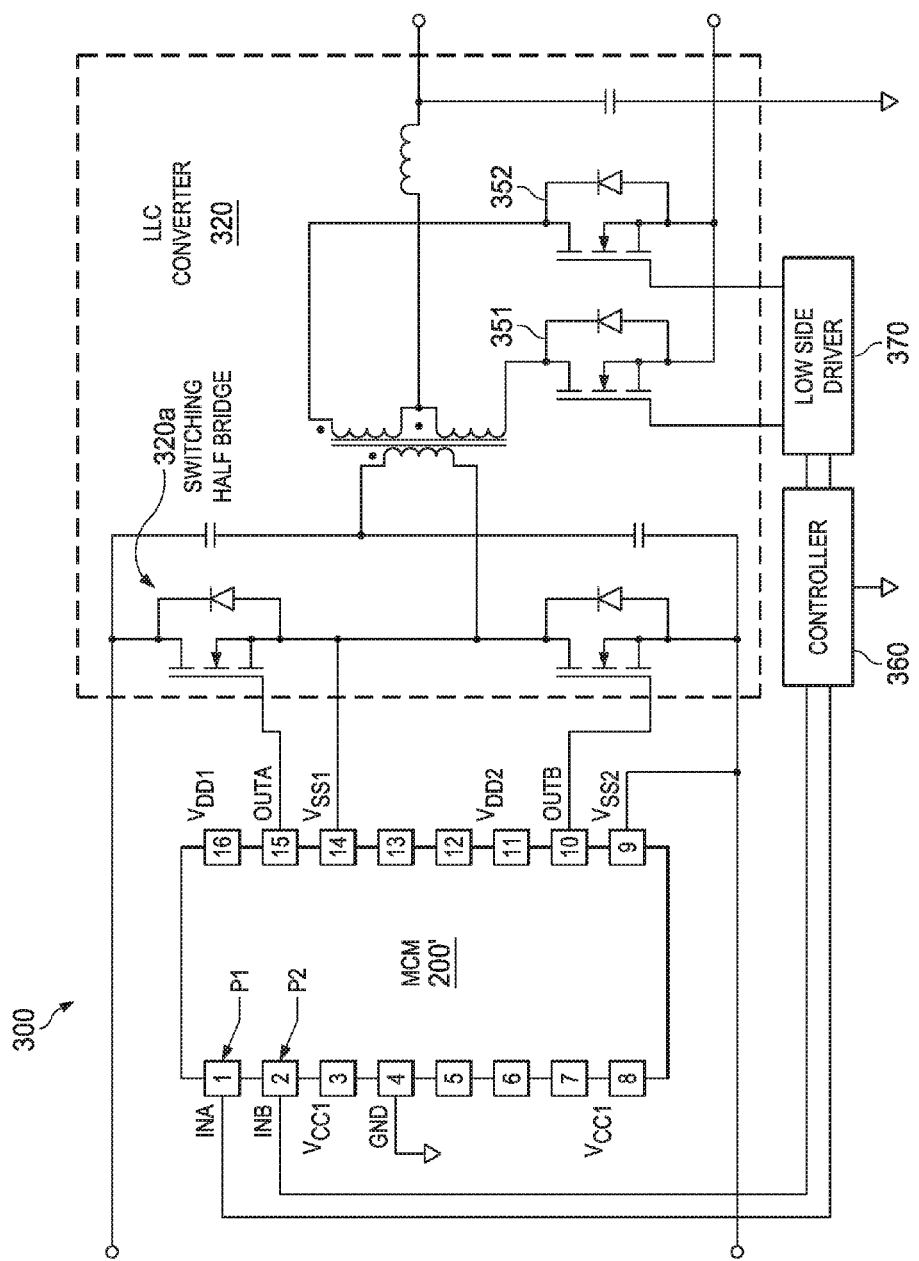
FIG. 3 depicts a power system including the MCM shown in FIG. 2 having capacitive isolation barriers coupled to drive the gates of switching half-bridge on the primary side of a half-bridge LLC power converter.

FIG. 3 depicts a power system 300 including MCM 200 shown as MCM 200' having capacitive isolation barriers coupled to drive the gates of the power FETs of switching half-bridge 320a on the primary side of a half-bridge LLC power converter 320. System includes a controller 360 that provides control signals (e.g., PWM signals) to the respective channels as inputs INA (to P1) and INB (to P2) of the MCM 200'. A low side driver 370 is also shown coupled to drive gates a power FETs 351, 352 in the rectifier section of the half-bridge power converter 320.

Examples

Disclosed embodiments are further illustrated by the following specific Examples, which should not be construed as limiting the scope or content of this Disclosure in any way.

Figure 4A:
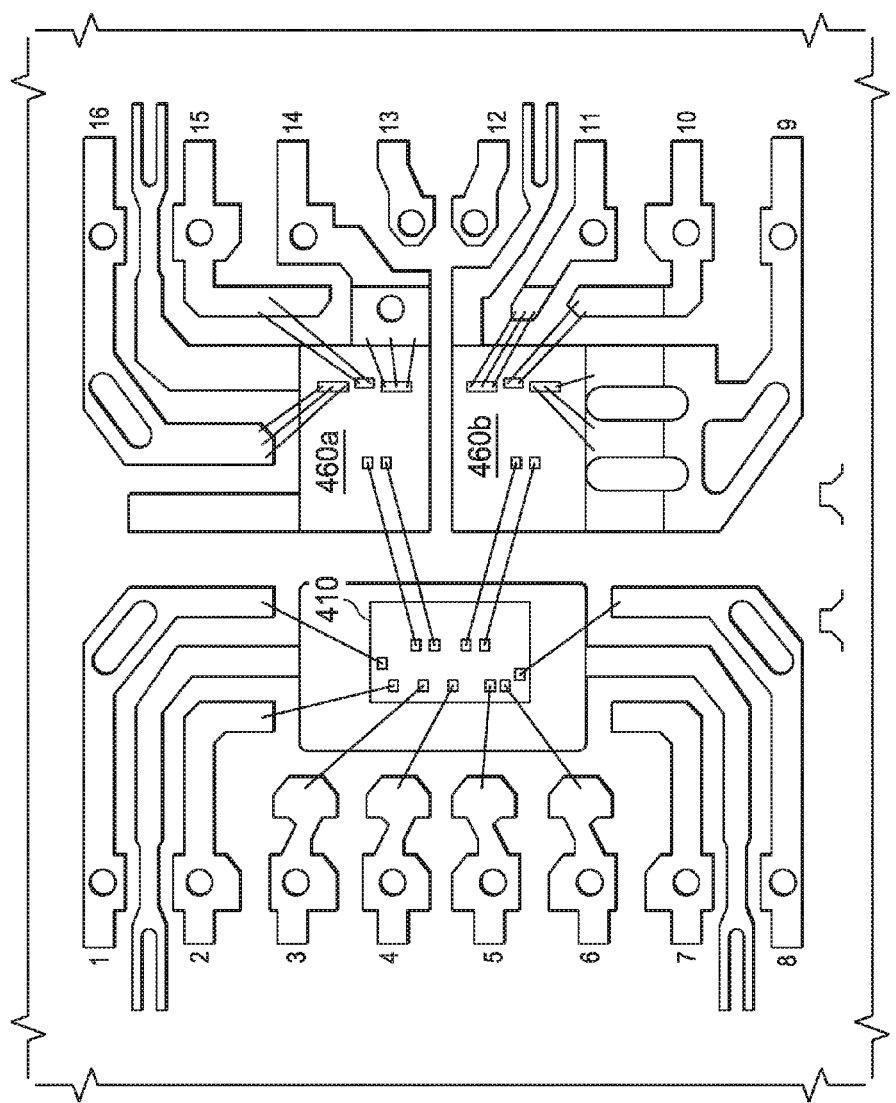
FIG. 4A shows an example metal layout together with bond wires for the isolated gate driver shown in FIG. 2.

FIG. 4A shows an example metal layout together with inter-die bond wires for the isolated gate driver shown in FIG. 2 embodied with one TX die 410 and 2 RX die shown as 460a and 460b each providing one channel. However, a single RX chip can provide both channels. Each channel has 2 inter-die bond wires shown. The coupling circuitry 120 on the TXD die 410 included SW1-SW8 shown in FIGS. 1A and 1B for enabling inter-die bond wire checking.

Figure 4B:
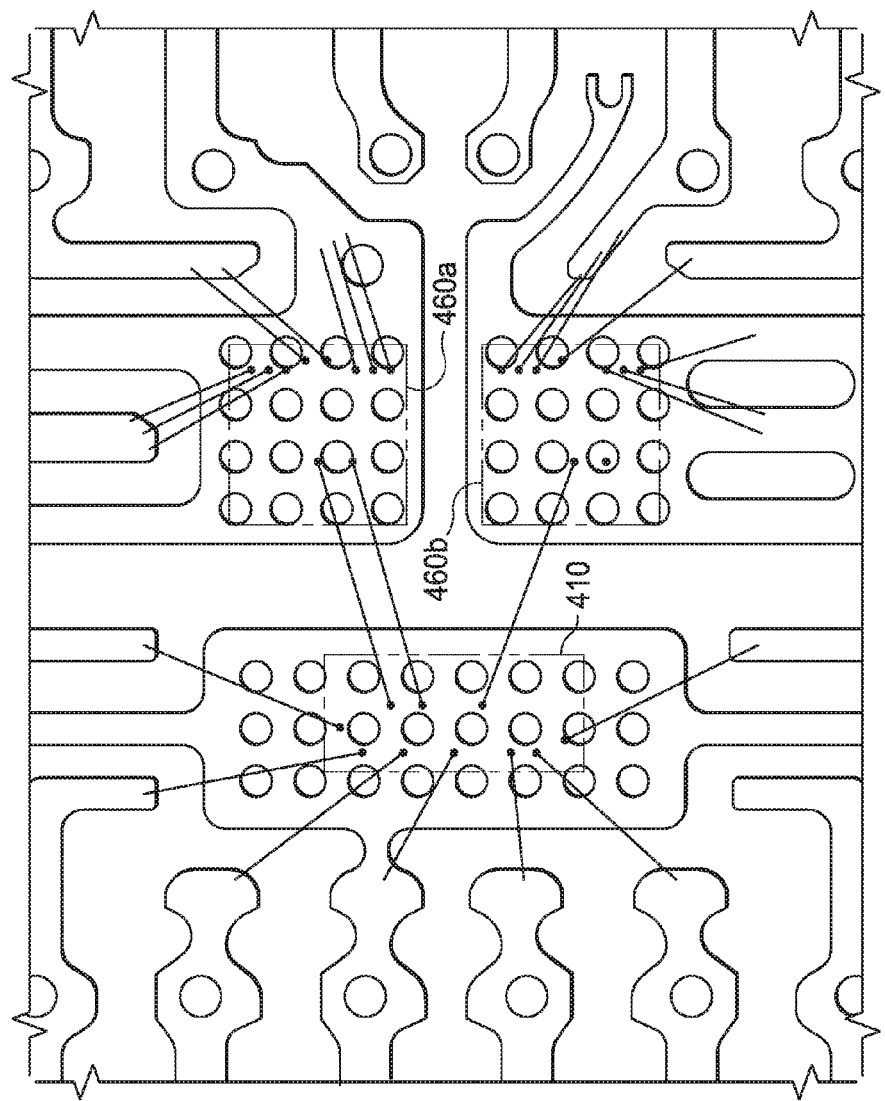
FIG. 4B shows a scanned X-ray image of an isolated gate drive die having a missing bond wire in one of the channels that was successfully identified by disclosed bond wire testing.

FIG. 4B shows a scanned X-ray image of an isolated gate drive die having a missing bond wire in one of the channels. The bottom channel has only 1 of the 2 intended inter-die bond wires, which as described above would not affect device functionality, but can affect noise performance. The particular missing bond wire was successfully identified by a disclosed inter-die bond wire checking method.

Disclosed embodiments can be used to bond wire test a variety of different IC devices and related products. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A multichip module (MCM) device, comprising:
a first die including functional circuitry bonded by a plurality of inter-die bond wires (bond wires) to a second die having functional circuitry, an integrated circuit (IC) device including a first channel (Channel A) and at least a second channel (Channel B) each with separate top and bottom signal paths (signal paths) including one of said bond wires, wherein a failure of any of said signal paths does not affect functionality of said IC device, because of the plurality of paths created by the top and bottom signals paths;
said second die providing an output pin for said Channel A (OUTA) and an output pin for said Channel B (OUTB),
said first die comprising input pins including a first input pin (P1), a second input pin (P2), and coupling circuitry including cross-channel test circuitry positioned between said input pins and said functional circuitry, said coupling circuitry providing said Channel A and said Channel B in a first configuration for normal mode operation and a second configuration for test mode operation for single bond wire testing for checking continuity of any of said bond wires, wherein said coupling circuitry includes a first switch or first logic gate for switchably coupling said P1 to said Channel B, a second switch or second logic gate for switchably coupling said P2 to said Channel A, a third switch or third logic gate for switchably decoupling said P1 from one of said top and bottom signal paths of said Channel A coupled to during said normal mode operating, and a fourth switch or fourth logic gate for switchably decoupling said P2 from one of said top and bottom signal paths of said Channel B coupled to during said normal mode operating.

2. The MCM device of claim 1, wherein said cross-channel test circuitry comprises switches.

3. The MCM device of claim 1, wherein said cross-channel test circuitry comprises logic gates.

4. The MCM device of claim 1, wherein said top and bottom signal paths of said Channel A and said Channel B each include at least one isolation barrier.

5. The MCM device of claim 4, wherein said isolation barrier comprises a capacitive barrier or an inductive barrier.

6. The MCM device of claim 5, wherein said MCM device comprises an isolated gate driver, said first die comprises a transmitter die and said second die comprises a receiver die, said top and bottom signal paths of said first die being positive modulation path (PMP) and negative modulation path (NMP), respectively.

7. A method of inter-die bond wire testing, comprising:
providing a multichip module (MCM) device including a first die including functional circuitry bonded by a plurality of inter-die bond wires (bond wires) to a second die having functional circuitry, an integrated circuit (IC) device including a first channel (Channel A) and at least a second channel (Channel B) each with separate top and bottom signal paths (signal paths) including one of said bond wires, wherein a failure of any of said signal paths does not affect functionality of said integrated circuit (IC) device, because of the plurality of paths created by the top and bottom signals paths, said second die providing an output pin for said Channel A (OUTA) and an output pin for said Channel B (OUTB), said first die comprising input pins including a first input pin (P1), a second input pin (P2), and coupling circuitry including cross-channel test circuitry positioned between said input pins and said functional circuitry, said coupling circuitry providing for said Channel A and said Channel B in a first configuration for normal mode operation and a second configuration for test mode operation for single bond wire testing for checking continuity of any of said bond wires;

first single bond wire testing (first testing) with said coupling circuitry set in said first configuration to obtain first test results;

at least a second single bond wire testing (second testing) with said coupling circuitry set in said second configuration different from said first configuration to obtain second test results, and from said first test results and said second test results identifying failures for any of said bond wires, wherein said first testing comprises applying a first input signal IN1 signal to said P1 transmitted through said top or bottom signal path of said Channel A and a first or second of said bond wires (BW1, BW2) to said OUTA and through said top or bottom signal path and a third or fourth of said bond wires (BW3, BW4) of said Channel B to said OUTB, wherein if there is no signal on said OUTA, another of said BW1 or said BW2 fails, and if there is no signal on said OUTB, another of said BW3 or said BW4 fails, and wherein said second testing comprises applying a second input signal IN2 to said P2 transmitted through said top or bottom signal path and another of said BW3 or said BW4 of said Channel B to said OUTB and through said top or bottom signal path and another of said BW1 or said BW2 to said OUTA, wherein if there is no signal on said OUTA, another of said BW1 or said BW2 fails, and if there is no signal on said OUTB, another of said BW3 or said BW4 fails.

8. The method of claim 7, wherein said cross-channel test circuitry comprises switches.

9. The method of claim 7, wherein said cross-channel test circuitry comprises logic gates.

10. The method of claim 7, wherein said top and said bottom signal paths of said Channel A and said Channel B each include at least one isolation barrier.

11. The method of claim 10, wherein said isolation barrier comprises a capacitive barrier or an inductive barrier.

12. The method of claim 11, wherein said MCM device comprises an isolated gate driver, said first die comprises a transmitter die and said second die comprises a receiver die, said top and bottom signal paths of said first die being positive modulation path (PMP) and negative modulation path (NMP), respectively.

13. A multichip module (MCM) isolated gate driver, comprising:

a transmitter die including functional circuitry bonded by a plurality of inter-die bond wires (bond wires) to a receiver die having functional circuitry, said MCM including a first channel (Channel A) with a positive modulation path (PMP) and at least a second channel (Channel B) with a separate negative modulation path (NMP) each including a plurality of said bond wires, wherein for each channel top and bottom signal paths of said Channel A and said Channel B, each include at least one a capacitive barrier or an inductive barrier, wherein a failure of one of said PMP and NMP bond wires does not affect functionality of said MCM;

said receiver die providing an output pin for said Channel A (OUTA) and an output pin for said Channel B (OUTB), said transmitter die comprising input pins including a first input pin (P1), a second input pin (P2), and coupling circuitry including cross-channel test circuitry positioned between said input pins and said functional circuitry, said coupling circuitry providing for said Channel A and said Channel B a first configuration for normal mode operation and a second configuration for test mode operation for single bond wire testing for checking continuity of any of said bond wires.

14. A power system, comprising:

a multichip module (MCM) isolated gate driver coupled to drive gates of a switching half-bridge on a primary side of a half-bridge power converter;

said MCM comprising:

a transmitter die including functional circuitry bonded by a plurality of inter-die bond wires (bond wires) to a receiver die having functional circuitry, said MCM including a first channel (Channel A) with a positive modulation path (PMP) and at least a second channel (Channel B) with a separate negative modulation path (NMP) each including a plurality of said bond wires, wherein top and bottom signal paths of said Channel A and said Channel B, each include at least one a capacitive barrier or an inductive barrier, wherein a failure of one of said PMP and NMP bond wires does not affect functionality of said MCM;

said receiver die providing an output pin for said Channel A (OUTA) and an output pin for said Channel B (OUTB), said transmitter die comprising input pins including a first input pin (P1), a second input pin (P2), and coupling circuitry including cross-channel test circuitry positioned between said input pins and said functional circuitry, said coupling circuitry providing for said Channel A and said Channel B a first configuration for normal mode operation and a second configuration for test mode operation for single bond wire testing for checking continuity of any of said bond wires;

a controller coupled to said P1 and said P2 for providing control signals to said MCM, and a low side driver coupled to the drive gates of power transistors in a rectifier section of said half-bridge power converter.

* * * * *